United States Patent
Eid et al.

(10) Patent No.: US 11,322,456 B2
(45) Date of Patent: May 3, 2022

(54) DIE BACK SIDE STRUCTURES FOR WARPAGE CONTROL

(71) Applicant: Intel Corporation, Santa Clara, CA (US)

(72) Inventors: Feras Eid, Chandler, AZ (US); Venkata Suresh R. Guthikonda, Phoenix, AZ (US); Shankar Devasenathipathy, Tempe, AZ (US); Chandra M. Jha, Tempe, AZ (US); Je-Young Chang, Phoenix, AZ (US); Kyle Yazzie, San Tan Valley, AZ (US); Prasanna Raghavan, Chandler, AZ (US); Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/611,830

(22) PCT Filed: Jun. 30, 2017

(86) PCT No.: PCT/US2017/040482
§ 371 (c)(1),
(2) Date: Nov. 7, 2019

(87) PCT Pub. No.: WO2019/005152
PCT Pub. Date: Jan. 3, 2019

(65) Prior Publication Data
US 2020/0066655 A1 Feb. 27, 2020

(51) Int. Cl.
*H05K 1/18* (2006.01)
*H01L 23/00* (2006.01)
(Continued)

(52) U.S. Cl.
CPC ............ *H01L 23/562* (2013.01); *H01L 21/50* (2013.01); *H01L 23/544* (2013.01);
(Continued)

(58) Field of Classification Search
CPC ..... H01L 23/562; H01L 21/50; H01L 23/544; H01L 25/0655; H01L 23/492;
(Continued)

(56) References Cited

U.S. PATENT DOCUMENTS

| | | | | |
|---|---|---|---|---|
| 5,610,442 A | * | 3/1997 | Schneider | H01L 24/32 257/787 |
| 6,117,797 A | * | 9/2000 | Hembree | H01L 21/4871 257/E23.125 |

(Continued)

OTHER PUBLICATIONS

International Search Report and Written Opinion for International Patent Application No. PCT/US2017/040482 dated Feb. 27, 2018, 14 pgs.

(Continued)

*Primary Examiner* — Steven T Sawyer
(74) *Attorney, Agent, or Firm* — Schwabe, Williamson & Wyatt, P.C.

(57) ABSTRACT

A foundation layer having a stiffener and methods of forming a stiffener are described. One or more dies are formed over the foundation layer. Each die has a front side surface that is electrically coupled to the foundation layer and a back side surface that is opposite from the front side surface. A stiffening layer (or a stiffener) is formed on the back side surface of at least one of the dies. The stiffening layer may be directly coupled to the back side surface of the one or more dies without an adhesive layer. The stiffening layer may include one or more materials, including at least one of a metal, a metal alloy, and a ceramic. The stiffening layer may be formed to reduce warpage based on the foundation (Continued)

layer and the dies. The one or more materials of the stiffening layer can be formed using a cold spray.

20 Claims, 9 Drawing Sheets

(51) Int. Cl.
*H01L 21/50* (2006.01)
*H01L 23/544* (2006.01)
*H01L 25/065* (2006.01)
*H05K 1/02* (2006.01)

(52) U.S. Cl.
CPC ....... *H01L 25/0655* (2013.01); *H05K 1/0271* (2013.01); *H05K 1/181* (2013.01)

(58) Field of Classification Search
CPC ..... H01L 24/31; H01L 24/83; H01L 23/3675; H01L 2924/01047; H01L 2924/13091; H01L 2924/01005; H01L 23/40; H01L 2924/1616; H01L 2224/16225; H01L 2924/01078; H01L 2924/15312; H01L 2224/83192; H01L 2224/73153; H01L 2224/83801; H01L 2924/01029; H01L 2224/73253; H01L 2924/16152; H01L 2924/014; H01L 2924/01033; H01L 2924/01006; H01L 2924/1306; H01L 2924/351; H05K 1/0271; H05K 1/181; H05K 2201/09136; Y10S 257/924
See application file for complete search history.

(56) References Cited

U.S. PATENT DOCUMENTS

| | | | |
|---|---|---|---|
| 2002/0109226 A1* | 8/2002 | Khan | H01L 23/3128 257/737 |
| 2003/0057550 A1* | 3/2003 | Zhao | H01L 23/24 257/734 |
| 2003/0211660 A1* | 11/2003 | Lim | H01L 23/50 438/127 |
| 2008/0067645 A1* | 3/2008 | Foong | H01L 23/42 257/675 |
| 2008/0296754 A1 | 12/2008 | Hua et al. | |
| 2009/0001555 A1* | 1/2009 | Ando | H01L 23/3675 257/708 |
| 2009/0244867 A1* | 10/2009 | Bahadur | H01L 21/56 361/783 |
| 2011/0235304 A1* | 9/2011 | Brown | H01L 23/16 361/820 |
| 2011/0291249 A1* | 12/2011 | Chi | H01L 21/56 257/675 |
| 2012/0126396 A1* | 5/2012 | Zhao | H01L 25/0657 257/737 |
| 2014/0091461 A1* | 4/2014 | Shen | H01L 21/563 257/738 |
| 2014/0363929 A1 | 12/2014 | Malatkar et al. | |
| 2015/0125636 A1* | 5/2015 | Chan | C25D 11/022 428/34.1 |
| 2015/0181697 A1* | 6/2015 | Goida | H01L 24/32 361/728 |
| 2016/0056055 A1 | 2/2016 | Ko et al. | |
| 2017/0012034 A1 | 1/2017 | Fischer et al. | |
| 2017/0022051 A1* | 1/2017 | Xue | B81B 7/0048 |
| 2018/0261528 A1* | 9/2018 | Chen | H01L 23/16 |
| 2019/0393051 A1* | 12/2019 | Kawano | H01L 24/20 |

OTHER PUBLICATIONS

International Preliminary Report on Patentability for International Patent Application No. PCT/US2017/040482, dated Jan. 9, 2020, 10 pages.

* cited by examiner

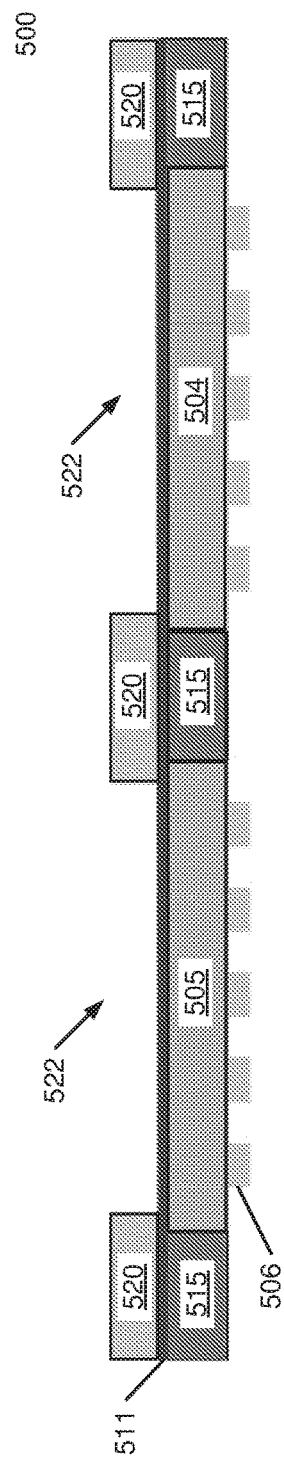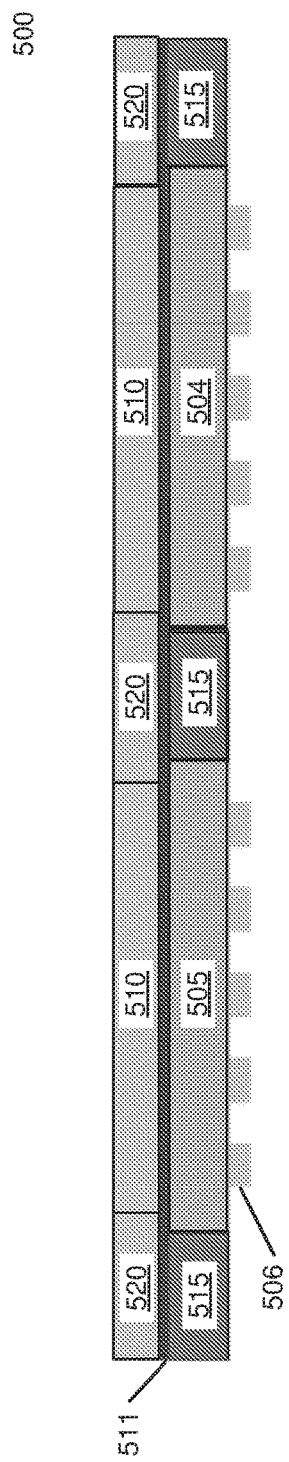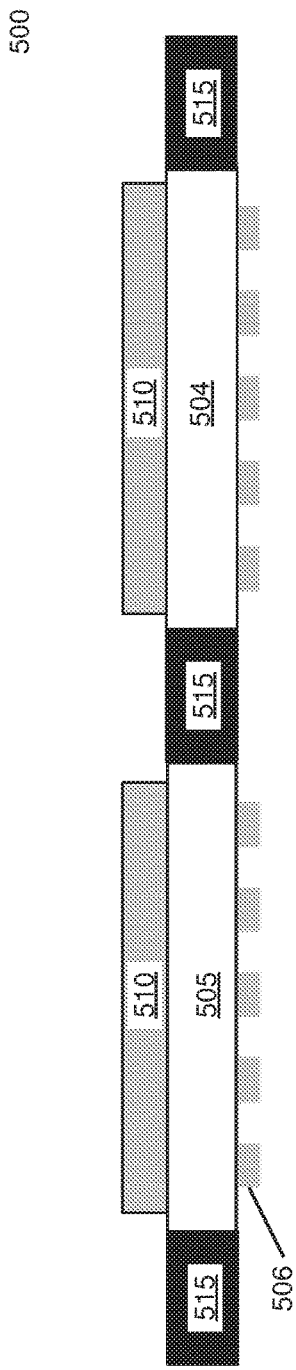

DIE BACK SIDE STRUCTURES FOR WARPAGE CONTROL

CROSS-REFERENCE TO RELATED APPLICATION

This patent application is a U.S. National Phase Application under 35 U.S.C. § 371 of International Application No. PCT/US2017/040482, filed Jun. 30, 2017, entitled "DIE BACK SIDE STRUCTURES FOR WARPAGE CONTROL," which designates the United States of America, the entire disclosure of which is hereby incorporated by reference in its entirety and for all purposes.

FIELD

Embodiments relate to semiconductor devices. More particularly, the embodiments relate to packaging semiconductor devices with a stiffener directly attached to a back side of a die.

BACKGROUND

Packaging semiconductor devices, such as silicon (Si) wafers or dies, present several problems. One such problem is that the dies generate package warpage. Package warpage is typically generated as a result of a coefficient of thermal expansion (CTE) mismatch between the die and the substrate.

As an effective approach, packaging solutions typically use stiffeners comprising metallic materials to reduce package warpage. This presents additional problems for packaging solutions, especially for the current stiffener applications, such as a picture frame stiffener and a die-backside-stiffener (DBS). FIGS. 1A-B illustrate these problems.

FIG. 1A illustrates a typical semiconductor package 100 using a picture frame stiffener solution. As shown in FIG. 1A, the typical semiconductor package 100 includes a substrate 102, an underfill layer 106, one or more dies 104-105, and one or more picture frame stiffeners 110. Conventionally, the picture frame stiffeners 110 are attached to the substrate 102 with the underfill layer 106 or another adhesive and located at the periphery of the substrate 102.

A major disadvantage of the picture frame stiffener is that it typically requires assembly at the unit level (often after depositing the adhesive layer), which adds extra assembly steps and reduces the overall throughput. Another disadvantage of the picture frame stiffener is an increased z-height of the semiconductor package. Further, the drive to meet the need for expansion of the die-to-package area ratio (in the x-y plane) is, however, drastically reducing the width of the picture frame stiffener on the periphery of the substrate. This leads to a major problem as the reduced/limited width of the picture frame stiffener decreases the effectiveness of controlling the package warpage.

Similar to FIG. 1A, FIG. 1B illustrates a typical semiconductor package 150 using a DBS solution. As shown in FIG. 1B, the typical semiconductor package 150 includes a substrate 102, an underfill layer 106, one or more dies 104-105, and a DBS 111. Conventionally, the DBS 111 is attached on the backside of the die 105 with an adhesive layer 103 (e.g., an epoxy film).

A major disadvantage of using the DBS is the adhesive layer between the die and the DBS. The required adhesive layer reduces the mitigation of the package warpage due to the weak mechanical coupling between the die and the DBS, especially at high temperatures. Another disadvantage of the DBS is that the adhesive layer acts as a thermal bottleneck (due to its low conductivity), which limits the application of the DBS to low-power semiconductor devices.

Additionally, if a DBS layer is laminated onto the dies at the wafer level, this DBS layer will need to be patterned using lithography to create dicing streets. This increases the packaging steps of the semiconductor device and thus increases the overall manufacturing costs. Meanwhile, if the DBS is attached post-singulation at the unit level to avoid lithography, the DBS still requires additional assembly steps and reduces throughput—similar to the disadvantages of forming the picture frame stiffener on the substrate.

BRIEF DESCRIPTION OF THE DRAWINGS

Embodiments described herein are illustrated by way of example and not limitation in the figures of the accompanying drawings, in which like references indicate similar features. Furthermore, some conventional details have been omitted so as not to obscure from the inventive concepts described herein.

FIGS. 5-10 are cross-sectional view illustrations of a method of forming a stiffener on a back side of a die on a wafer, according to one embodiment.

DETAILED DESCRIPTION OF THE INVENTION

Figure 1A:
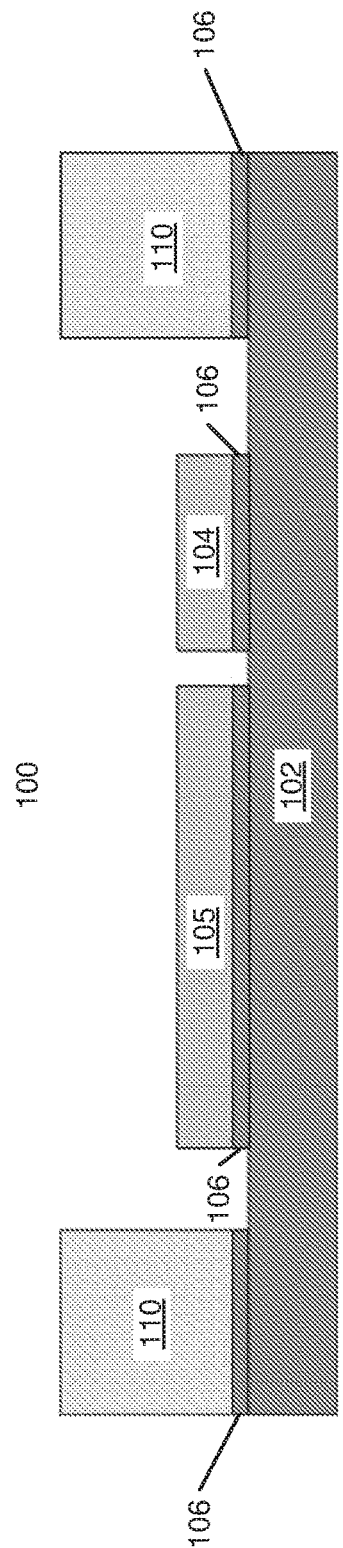
FIGS. 1A-B are cross-sectional views of typical semiconductor packages having a picture frame stiffener and a die-backside-stiffer (DBS), respectively, according to some embodiments.
Figure 1B:
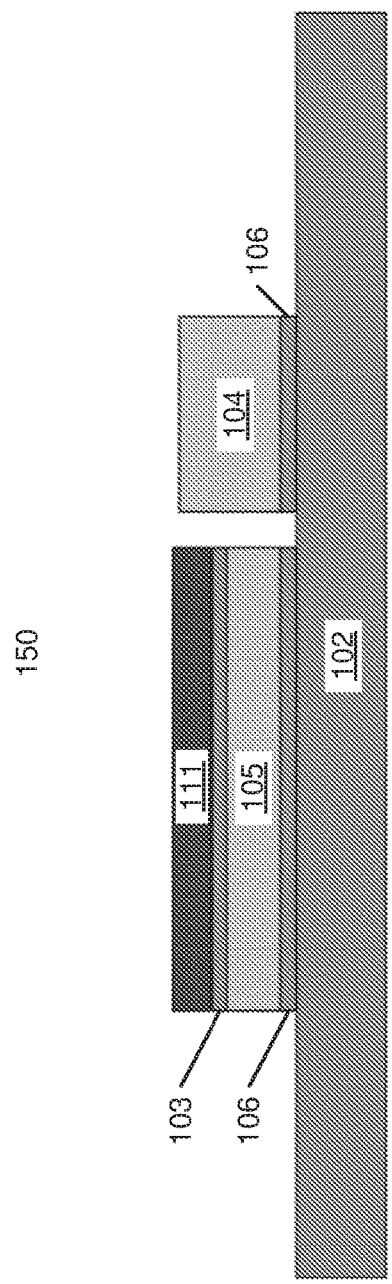

Described below are ways for forming a die back side structure on a back side of a die to perform as stiffeners for mitigating warpage. Specifically, a semiconductor package is described herein that includes a stiffener directly formed on a back side of a die using one or more additive manufacturing (AM) processes (e.g., a cold spray (CS) process) or semi-additive manufacturing processes. The stiffener is formed as one or more materials (e.g., metal, metal alloy, metal/ceramic composites, etc.) are deposited directly on the back side of a die (or a wafer) disposed on a foundation layer to mitigate package warpage.

Embodiments of the foundation layer enhance packaging solutions. For example, embodiments of the foundation layer help reduce package warpage by creating a stiffness layer (i.e., a stiffener) above the die to counteract a coefficient of thermal expansion (CTE) mismatch between the die and the substrate. In addition, embodiments of the foundation layer enable stiffening structures to be deposited directly on the back side of the die rather than using an adhesive layer (e.g., an epoxy film) to attach the die and the stiffener. Accordingly, these embodiments of the foundation layer strengthen the mechanical coupling between the die and stiffening structures, which allow the stiffener structures to improve warpage mitigation.

Embodiments of the foundation layer also facilitate a wide range of materials that can be used to enhance the modulus of the stiffener structures, including materials such as metals (e.g., copper (Cu), aluminum (Al), titanium (Ti), nickel (Ni), etc.), metal alloys (e.g., stainless steel), metal/ceramic composites (e.g., Cu/diamond, Cu/alumina, etc.), and/or any combination thereof. Further, embodiments of the foundation layer enable one or more AM processes, such as CS, that allow some of these materials to be used, which are not typically used in standard die and substrate manufacturing. As such, the stiffener materials can be managed so that their modulus and CTE are optimized for warpage or stress reduction by controlling the fractions of the constituent elements (an option that is not available when using pure metals such as Cu).

Embodiments of the foundation layer further enable simultaneous deposition and patterning at the wafer level when an AM process is used to realize the stiffening structures. The stiffener deposition can be limited to the die areas while leaving the dicing streets on the wafer vacant to facilitate subsequent dicing and avoid saw blade wear due to contact with the stiffener. As such, embodiments of the foundation layer increase throughput and are cost-efficient as they remove the need for expensive lithography steps for patterning.

In addition, embodiments of the foundation layer help to avoid back side metallization prior to the stiffener deposition. Accordingly, embodiments of the foundation layer provide the advantage that any adhesion or diffusion barrier layers can be incorporated as part of the stiffener deposition using the same equipment. Lastly, embodiments of the foundation layer help to overcome the limitations on (i) the expansion of the die-to-package area ratio (in the x-y plane) since the stiffener is applied directly on the backside of the die, and (ii) the need for miniaturization of packages since the stiffener is deposited directly on the backside of the die without any adhesive layer (i.e., reducing the overall z-height of the package). Embodiments of the foundation layer, therefore, help to form stiffening die back side structures for mitigating warpage on packages without increasing z-height, cost, and total number of manufacturing steps.

Figure 2:
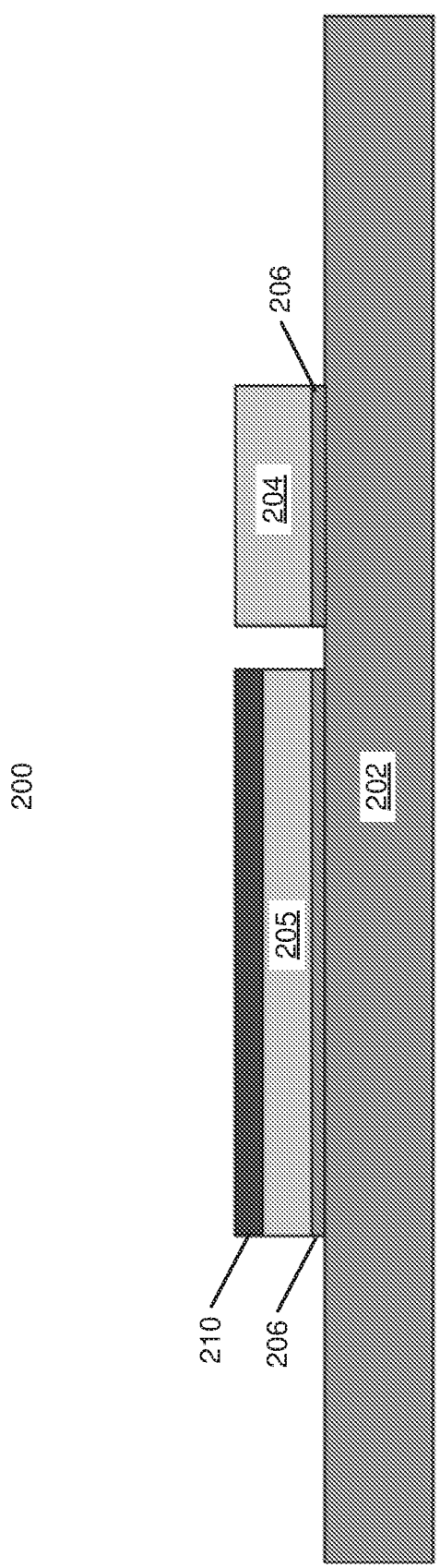
FIG. 2 is a cross-sectional view of a semiconductor package that includes a foundation layer, one or more dies, and a stiffener, according to one embodiment.

FIG. 2 illustrates a cross-sectional view of a semiconductor package 200 that includes a foundation layer 202, one or more dies 204-205, an underfill layer 206, and a stiffener 210.

As used herein, a "stiffener" refers to using one or more materials to act as a stiffening structure (or stiffening layer) on a back side of a die for mitigating warpage. Further, a "stiffener" may be formed using materials such as metals (e.g., copper (Cu), aluminum (Al), titanium (Ti), nickel (Ni), etc.), metal alloys (e.g., stainless steel), metal/ceramic composites (e.g., Cu/diamond, Cu/alumina, etc.), and/or any combination thereof. As used herein, a "stiffener" (also referred to as a die back side structure) is deposited directly on the backside of the die at a panel-level or a wafer level without using an adhesive layer to attach the die and the stiffener, where the die can be attached to a foundation layer. As used herein, a "foundation layer" refers to, but is not limited to, a substrate, a package, a motherboard, and a printed circuit board (PCB). As used herein, a "z-height" refers to a unit of measurement on the z-axis in a three-dimensional package, which is usually oriented vertically.

Referring now to FIG. 2, the semiconductor package 200 has dies 204-205 disposed on the foundation layer 202. For one embodiment, each of the dies 204-205 has a front side surface that is electrically coupled to the foundation layer 202 via the underfill layer 206 which is understood to also include first level interconnects (FLI) such as solder bumps. According to some embodiments, die 205 has a back side surface (also referred to as the back side) directly bonded with the stiffener 210 without needing an adhesive layer (e.g., an epoxy film, an attachment film, etc.) to attach the back side of the die 205 and the stiffener 210. As such, by directly forming the stiffener 210 on the back side of the die 205 (without using an adhesive layer), the overall z-height of the semiconductor package 200 is reduced.

For one embodiment, each of the one or more dies 204-205 includes, but is not limited to, a semiconductor die, an integrated circuit, a CPU, a microprocessor, and a platform controller hub (PCH). The stiffener 210 (also referred to as a stiffener structure or a stiffening layer) is formed directly on the back side of die 205 to mitigate warpage (i.e., the package warpage of semiconductor package 200) generated by the CTE mismatch between the die 205 and the foundation layer 202. According to some embodiments, the stiffener 210 may be formed using materials such as metals (e.g., copper (Cu), aluminum (Al), titanium (Ti), nickel (Ni), etc.), metal alloys (e.g., stainless steel), metal/ceramic composites (e.g., Cu/diamond, Cu/alumina), and/or any combination thereof.

For example, the materials of the stiffening layer 210 may be combined using one or more additive manufacturing (AM) processes, such as a cold spray process that enables a stiffening layer to be formed from a metal and a ceramic (e.g., Cu/diamond or Cu/alumina). For one embodiment, a cold spray process may be used to form the stiffener 210 directly on the backside of the die 205 at a wafer level and a panel level. The cold spray enables simultaneous deposition and patterning of high modulus materials and composites (e.g., Cu/diamond or Cu/alumina) that cannot be deposited using traditional substrate manufacturing techniques (e.g., lithography and plating techniques). In addition, according to some embodiments, the stiffener 210 may be formed to have one or more patterns (e.g., an "I" shaped stiffener, a picture frame shaped stiffener, a square/rectangular shaped stiffener, etc.). Note that the AM processes, such as the cold spray process, are described in further detail below.

Figure 3:
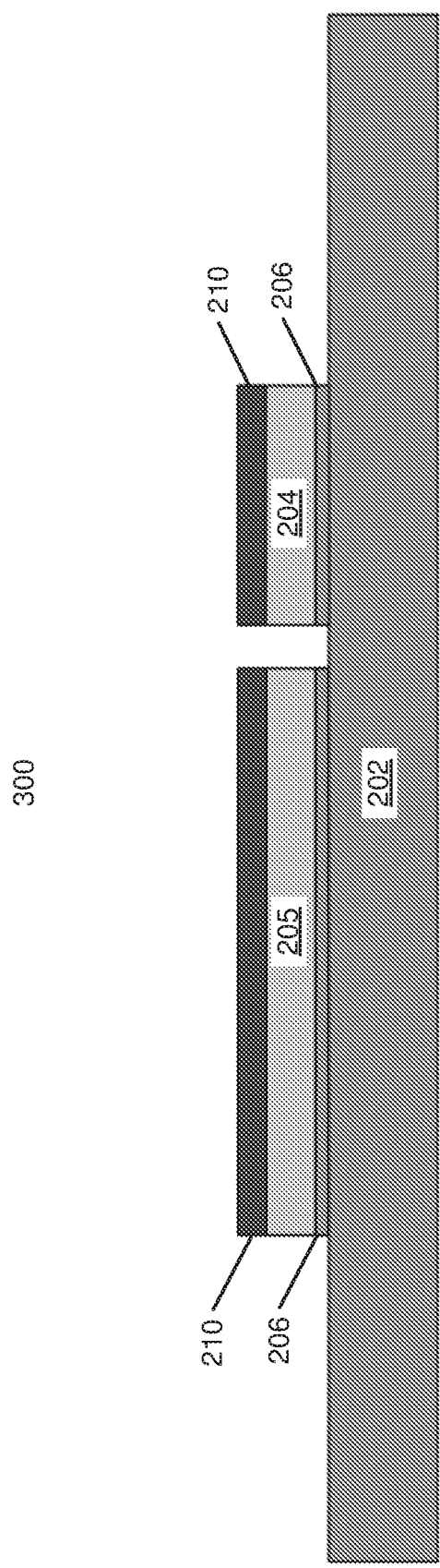
FIG. 3 is a cross-sectional view of a semiconductor package that includes a foundation layer, one or more dies, and one or more stiffeners, according to one embodiment.

For some embodiments, the foundation layer 202 may form a gap between each of the one or more dies 204-205, where the stiffener 210 may be formed only on die 205 (and/or die 204 as shown in FIG. 3) and not formed on the gap. According to some embodiments, an underfill layer 206 is formed between each of dies 204-205 and the foundation layer 202. For one embodiment, the foundation layer 202 may be formed on a motherboard (not shown), where the foundation layer 202 may be electrically coupled to the motherboard using solder bumps (not shown).

The foundation layer 202 may include, but is not limited to, a substrate, a package, and a printed circuit board (PCB), according to some embodiments. For one embodiment, the foundation layer 202 is a PCB. For one embodiment, the PCB is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown).

For some embodiments, holes (not shown) may be drilled in foundation layer 202. For one embodiment, the foundation layer 202 may also include conductive copper traces, metallic pads, and holes (not shown).

Foundation layer 202 is attached to dies 204-205 through the use of the underfill layer 206, which may include solder balls (or bumps) (not shown) that connect pads (not shown) on the foundation layer 202 and the dies 204-205. For example, the underfill layer 206 may be used on a ball grid array (BGA), a pin grid array (PGA), a land grid array (LGA), or any other connectivity packaging. For one embodiment, the underfill layer 206 may include controlled collapse chip connection (C4) bumps that connect pads (not shown) on the dies 204-205 and the foundation layer 202.

For some embodiments, the stiffener 210 is formed directly on the back side of die 205 (without an adhesive layer) using at least one of a metal, a metal alloy, and a ceramic (e.g., a combination of metal and ceramic composite materials). For example, by depositing a stiffening layer 210 (e.g., by plating a copper layer) on the back side of die 205, the stiffening layer 210 reduces the overall package warpage due to CTE mismatch between the die 205 and the foundation layer 202. Accordingly, the deposition of the stiffening layer 210 can be implemented on the back side of the die 205 at the panel level and/or the wafer level (as shown in FIGS. 4-10).

As shown in FIG. 2, the absence of an adhesive layer (or an epoxy film) on the back side of die 205 causes the direct bond formed between the stiffener 210 and the die 205 to have strong coupling at high temperatures. For example, the semiconductor package 200 removes weak coupling by depositing the stiffener 210 directly on top of the back side of die 205. That is, depositing the stiffener 210 on the back side of die 205 provides a direct bonding between die 205 and the stiffener 210 that mitigates/controls package warpage. In addition to mitigating/controlling package warpage, the stiffener 210 may also help to spread the heat from the die 205, according to some embodiments.

Figure 11C:
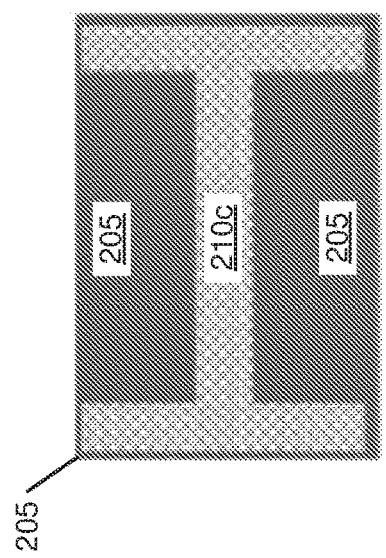
FIGS. 11A-C are plan views of dies formed with one or more stiffener patterns, according to one embodiment.
Figure 11B:
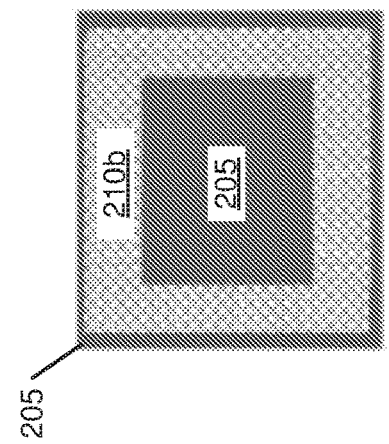
Figure 11A:
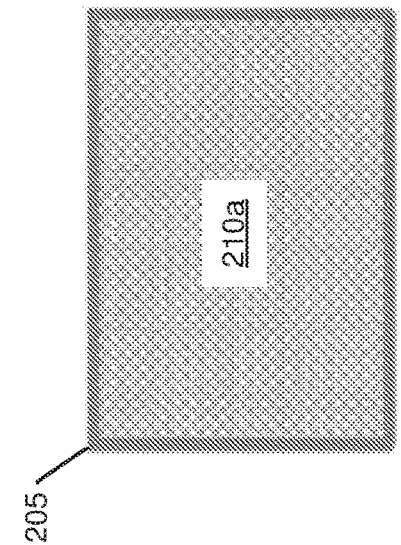

For certain embodiments, the stiffener 210 may be deposited with one or more AM processes. For one embodiment, the stiffener 210 is deposited using cold spray, which is one of the available AM processes. The cold spray process allows the deposition of various materials (e.g., stainless steel, Cu/diamond composites, aluminum, Cu, Ti, Ni, etc.) directly on the back side of a silicon (Si) wafer or a die according to a given pattern (e.g., as shown in FIGS. 11A-C). For example, the stiffener 210 may be formed with solid powders of one or more materials that are accelerated in a gas jet to high speeds before impinging on, and adhering to, the back side of die 205 on the foundation layer 202. The one or more materials may include, but are not limited to, metals, polymers, ceramics, composite materials, and nanocrystalline powders. Note that the stiffener 210 may have been formed on die 205 as one of multiple dies at the wafer level or at the panel level.

In addition, some of the advantages of using the cold spray process are that (i) lithography is not required to create patterns, and (ii) the deposition can be applied directly at the wafer level leaving space for the wafer streets (or diesaw/dicing streets) for subsequent singulation. Note that the stiffener 210 may be deposited, but is not limited to, using the cold spray process or any other additive processes.

For some embodiments, the deposition of a stiffener (e.g., stiffener 210) can be applied at the wafer level or the die level. The stiffener can include material compositions not typically available with standard substrate manufacturing processes, such as metal/ceramic composites (e.g., Cu/diamond) or metal alloys (e.g., stainless steel).

Figure 4:
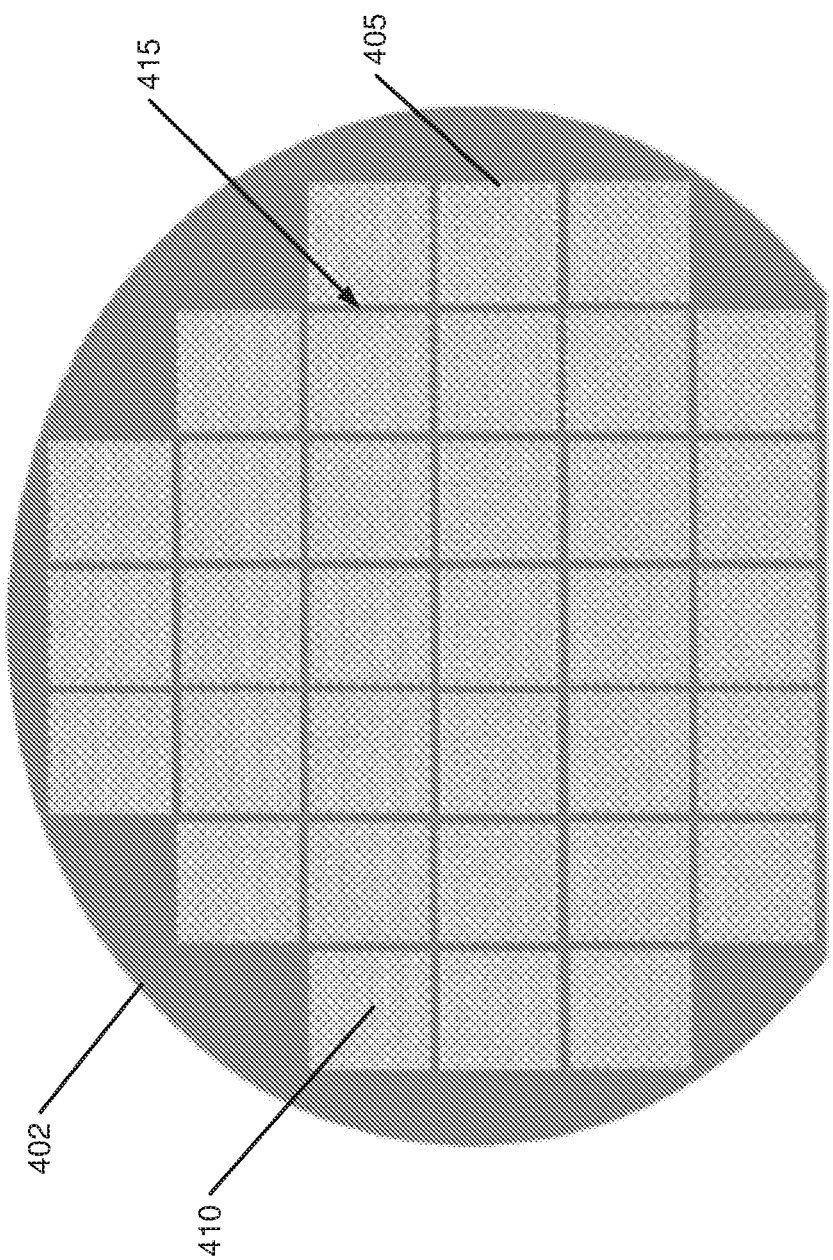
FIG. 4 is a plan view of a wafer having a plurality of dies and a plurality of dicing streets, according to one embodiment.

According to several embodiments, the stiffener (e.g., stiffener 210) can be formed and deposited using one or more AM processes. For some embodiments, the stiffener may be deposited as a stiffening layer (e.g., a Cu layer, a Cu/diamond layer, a stainless-steel layer, etc.) directly on the Si at the wafer level using a mask to form the stiffener directly above each of the dies, while contemporaneously forming dicing/wafer streets and other patterns in the stiffener (e.g., as shown in FIG. 4).

For one embodiment, after a wafer thinning, the stiffener may be deposited over the wafer (excluding the dicing streets), and the wafer is then diced after the stiffener is deposited. For another embodiment, after a lithography step is added to mask the dicing streets, the stiffener is then only deposited on top of the active die(s) and not on the dicing streets (e.g., as shown in FIGS. 5-10). For some embodiments, the stiffener is formed and deposited directly on the back side of the individual die (e.g., die 205) only at the panel level after the general die preparation (i.e., after the wafer thinning, the wafer dicing, etc.).

For certain embodiments, the material formulations of the stiffener (e.g., stiffener 210) can be controlled in order to provide increased advantages over using pure metals (e.g., Cu) by controlling the fractions of the individual components formed in the stiffener. For example, when a Cu/diamond mixture is used for a stiffener material instead of pure Cu, a stiffener (e.g., stiffener 210) may have (i) a higher modulus than the pure Cu that makes the stiffener more effective in warpage reduction, and (ii) a lower CTE than pure Cu that makes it closer to Si and thus reduces Si stresses especially when the stiffener deposition is carried out at the wafer level.

For most embodiments, the stiffening layer 210 is even more suitable for smaller form factors as (i) the x-y dimensions of substrates (e.g., the foundation layer 202) keep shrinking, and (ii) the z-height dimension of substrates keeps shrinking. As such, forming stiffener 210 (e.g., a metal layer, a metal alloy layer, and/or a metal/ceramic) on the back side of die 205 helps to mitigate the warpage generated by the CTE mismatch between die 205 and foundation layer 202.

Note that the semiconductor package 200 may include fewer or additional packaging components based on the desired packaging design.

FIG. 3 illustrates a cross-sectional view of a semiconductor package 300 that includes a foundation layer 202, one or more dies 204-205, an underfill layer 206, and a stiffener 210. Note that the semiconductor package 300 of FIG. 3 is similar to the semiconductor package 200 of FIG. 2, except that the semiconductor package 300 shows that the stiffener 210 can be deposited on the back sides of each of the dies 204-205.

As illustrated in FIG. 3, the semiconductor package 300 has dies 204-205 disposed on the foundation layer 202. For one embodiment, each of the dies 204-205 has a front side surface that is electrically coupled to the foundation layer 202 via the underfill layer 206. According to some embodiments, dies 204-205 have back side surfaces directly bonded with the stiffener 210 without needing an adhesive layer (e.g., an epoxy film) to attach the back sides of the dies 204-205 and the stiffener 210.

For one embodiment, each of the one or more dies 204-205 includes, but is not limited to, a semiconductor die, an integrated circuit, a CPU, a microprocessor, and a PCH.

The stiffener 210 is formed directly on the back sides of dies 204-205 to mitigate warpage (i.e., the package warpage of semiconductor package 300) generated by the CTE mismatch between dies 204-205 and the foundation layer 202.

According to some embodiments, a semiconductor package (e.g., semiconductor package 200 and/or 300) has one or more dies (e.g., dies 204-205) that are coupled to a thin substrate (e.g., foundation layer 202). The package may be attached to a board by a ball grid array (BGA) bonding process which typically includes the use of a high temperature mass reflow operation in order to reflow solder bumps. As described above, thin polymer substrates, such as foundation layers, are susceptible to deformation (or warping) due to temperature cycling between lower temperatures (e.g., room temperature) and higher temperatures (e.g., those required for mass reflow of solder bumps). Accordingly, some embodiments described herein include the formation of a stiffener (or a stiffening layer) (e.g., stiffener 210) disposed on the substrate prior to the mass reflow operation.

The stiffener increases the stiffness of the package and reduces the warpage that is caused by the reflow process. Furthermore, the stiffener may reduce the difficulty of handling a thin and flexible package because the stiffener provides rigidity to the otherwise flexible package. For example, a stiffener allows for the package to be handled and processed without specialized handling equipment that may be typically needed for such thin and flexible packages. Accordingly, processing equipment used in flip chip BGA (FCBGA) packages formed using thick and rigid multi-layered substrates can be used for the fabrication of thin FCBGA packages as well.

Referring now to FIG. 3, a semiconductor package 300 includes a foundation layer 202. For one embodiment, the foundation layer 202 may be a polymeric substrate. By way of example, the foundation layer 202 may be a polyamide or polyimide material. The foundation layer 202 may have a thickness T. For one embodiment, the foundation layer 202 may be a single layer substrate. Additional embodiments may also include multi-layer substrates, such as a substrate that includes two or more thin and flexible layers laminated together.

According to one embodiment, an underfill layer 206 (also referred to as an underfill (UF) material or UF/C4 bumps) may be deposited below the dies 204-205 and between solder bumps and pillars (not shown) that are formed below the dies 204-205, which electrically couple the dies 204-205 to the foundation layer 202. For one embodiment, the underfill layer 206 may include an epoxy underfill material. The underfill layer 206 may include particulate reinforcements in certain embodiments. For example, the underfill layer 206 may include filler particles made of silica, alumina, or the like. By way of example, the underfill layer 206 may have a viscosity that allows for the underfill layer to be dispensed with a capillary underfill process. Additional embodiments may include an underfill layer 206 that is suitable for use with a no-flow underfill process. For some embodiments, the underfill layer 206 may cover the front side surfaces of dies 204-205. As illustrated, the underfill layer 206 is formed below the front side surfaces of dies 204-205, but embodiments are not limited to such configurations.

For some embodiments, as described above, the stiffener 210 may include one or more materials, including metals, metal alloys, ceramics, and any combination therein. For one embodiment, the one or more materials selected for the stiffener 210 may be selected in order to optimize the effective CTE and modulus for producing minimal package warpage.

The CTE of the stiffener 210 may be modulated by increasing or decreasing the amount of the one or more materials (i.e., by controlling the fractions of the individual materials/components) that are included in formation of the stiffener 210. According to some embodiments, the one or more materials selected to form the stiffener 210 are based on counteracting the CTE mismatch between the dies 204-205 and the foundation layer 202.

For some embodiments, the stiffener 210 may be formed on the back side of the dies 204-205 with one or more patterns, including a pattern that covers the back side of the die (as shown in FIG. 11A) or other patterns that may not cover the entire back side of the die (as shown in FIGS. 11B-C). According to other embodiments, the thickness Ts of the stiffener 210 may be between approximately 20 μm and 80 μm.

Accordingly, embodiments of the stiffener 210 provide multiple improvements to packaging solutions. For one embodiment, the stiffener 210 improves the mechanical coupling between the dies 204-205 and the stiffener 210 which helps with the package warpage mitigation. Embodiments of the stiffener 210 also enable for one or more materials to be combined (and controlled) so that their modulus and CTE are optimized for warpage or stress reduction by controlling the fractions of the constituent elements.

In addition, when an AM process (e.g., cold spray) is used to deposit the stiffener 210, it enables simultaneous deposition and patterning of the stiffener 210 at the wafer level. This allows the deposition of the stiffener 210 to be limited to the die areas while leaving the dicing streets on the wafer vacant to facilitate subsequent dicing and avoid saw blade wear due to contact with the stiffener. This also increases throughput and removes the need for expensive lithography steps for patterning. Lastly, embodiments of the stiffener 210 do not require back side metallization prior to the deposition of stiffener 210 as such any adhesion promotion or diffusion barrier layers can be incorporated as part of the stiffener deposition using the same equipment.

Note that aside from the inclusion of the stiffener 210 above die 204, semiconductor package 300 may be noticeably similar to semiconductor package 200 as illustrated in FIG. 2. Also note that semiconductor package 300 may include fewer or additional packaging components based on the desired packaging design.

FIG. 4 illustrates a plan view of a wafer 402 containing one or more dies 405. In addition, FIG. 4 shows the deposition of a stiffening layer 410 (or a stiffener) at a wafer level using an AM process (e.g., cold spray).

For some embodiments, the wafer 402 has one or more dies 405 and one or more dicing streets 415. As shown in FIG. 4, the wafer 402 has the stiffening layer 410 deposited and patterned directly above each of the one or more dies 405 while leaving gaps for the one or more dicing streets 415.

According to some embodiments, the deposition and patterning of the stiffening layer 410 can be created using various processes, including an AM process such as cold spray. For certain embodiments, this AM process enables simultaneous deposition and patterning of high modulus materials and composites that typically cannot be deposited using traditional substrate manufacturing techniques.

For example, using an additive deposition process for the stiffening layer 410 at the wafer level increases throughput and allows direct patterning of diesaw/dicing streets. This is beneficial for subsequent dicing so that the saw blade does not contact or get impacted by the deposited stiffening layer(s) 410. This facilitates subsequent dicing by eliminating contact between the saw blade and the stiffening layer 410, which is beneficial for reducing blade wear if hard-to-dice materials such as Cu/diamond or stainless steel are used for the stiffening layer 410. The deposition of the stiffening layer 410 enables for the dicing streets 415 and other patterns in the stiffening layer 410 to be created directly during disposition as part of the additive manufacturing process.

For one embodiment, the deposition of the stiffening layer 410 may include one or more materials such as metals, metal alloys, and metal/ceramic composites as described above. In addition, the stiffening layer 410 can be deposited at the wafer level without the requirement for pre-deposited back side metallization, according to one embodiment. For another embodiment, using the AM process as shown in FIG. 4 allows for the stiffening layer to be customized to one or more desired patterns, which may help improve the warpage mitigation.

For alternative embodiments, the deposition of a stiffening layer may be formed using techniques other than AM processes. For example, as described above, a resist deposition and patterning can be applied at the wafer level, followed by electroplating or metal deposition and liftoff. This approach, however, may be limited to fewer material options and may require multiple steps for deposition and patterning as compared to an AM process, such as using a cold spray deposition. Accordingly, as shown in FIG. 4, the deposition of the stiffening layer 410 using an AM process helps to decrease the total number of fabrication steps (which reduces overall manufacturing costs) and increases the pool of available materials.

Note that the stiffener layer 410 of FIG. 4 may be noticeably similar to the stiffener 210 as illustrated in FIGS. 2-3.

FIGS. 5-10 illustrate cross-sectional views of a method of forming a stiffener on a back side of a die in a wafer 500. As described above, a stiffener may be formed using one or more processes. For one embodiment, as shown in FIGS. 5-10, a stiffener is formed using a plating process at the wafer level.

Figure 5:

FIG. 5 illustrates one or more dies 504-505 and one or more streets 515 (e.g., wafer dicing streets) formed on wafer 500. For one embodiment, the dies 504-505 have solder bumps 506 that can be used to electrically couple the dies 504-505 to a substrate. For one embodiment, dies 504-505 may be placed/disposed on a rigid support/carrier (not shown). The one or more streets 515 may be formed to have one or more patterns (and widths).

Figure 6:
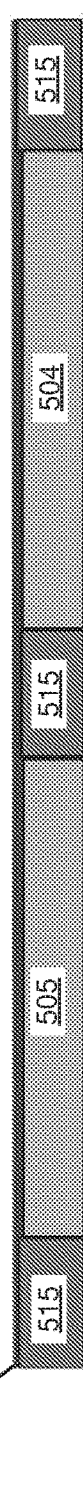

FIG. 6 illustrates a seed layer 511 deposited over the dies 504-505 and the streets 515 of the wafer 500. For one embodiment, the seed layer 511 is a metallic seed layer (e.g., a Cu seed layer) that is sputtered. For some embodiments, FIGS. 7-10 then illustrate forming a stiffener (e.g., stiffener 510 of FIG. 10) above dies 504-505 in the wafer 500.

Figure 7:
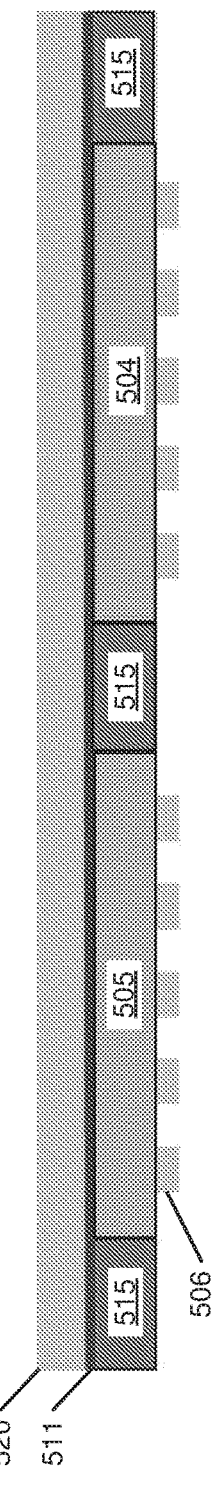

FIG. 7 illustrates a photoresist layer 520 deposited over the seed layer 511, the dies 504-505, and the streets 515 of the wafer 500. For some embodiments, the photoresist layer 520 may be a dry film resist (DFR) layer(s). The photoresist layer 520 may include, but is not limited to, polyimides, epoxy acrylates, benzocyclobuten (BCB), polybenzoxazole (PBO), negative tone acrylic based resist, etc. For one embodiment, the photoresist layer 520 may provide a stiffener opening (e.g., stiffener opening 522 of FIG. 8) in the wafer 500 that enables the desired stiffener thickness and planar (xy) dimensions to mitigate the package warpage. As such, for one embodiment, stiffener openings 522 can be created with the desired dimensions in the photoresist layer 520 using, for example, a lithographical process, a laser drilling process, or any other processes known in the art.

FIG. 8 illustrates the photoresist layer 520 formed with one or more stiffener openings 522 over the dies 504-505. For one embodiment, the patterning of the photoresist layer 520 may be implemented with one or more patterning processes (e.g., exposed with a radiation source through a mask (not shown) and developed with a developer (not shown)). For some embodiments, the stiffener openings 522 may be formed in any desired shape. For one embodiment, the stiffener openings 522 have substantially vertical sidewalls. Note, however, that a stiffener (e.g., stiffener 510 of FIG. 10) and its stiffener opening (e.g., stiffener opening 522 of FIG. 8) may be customized for any given pattern and purpose.

FIG. 9 illustrates a stiffening layer/material (e.g., Cu) deposited (e.g., plated) into the one or more stiffener openings 522 to form stiffeners 510 directly on the back side surfaces of dies 504-505. As described herein, the stiffeners 510 are formed directly above the back sides of the dies 504-505 to mitigate warpage by counteracting the CTE mismatch between die 504-505 and the package substrates (e.g., organic substrates) to which the die are subsequently attached. Based on the deposition process, the stiffening layer may include one or more materials as described above. In addition, as shown in FIGS. 8-10, the stiffener 510 is formed above the dies 504-505 without using an adhesive layer to attach the stiffener 510 and the dies 504-505. FIG. 10 then illustrates the remaining photoresist layer 520 and seed layer 511 removed from the wafer 500. As such, the wafer 500 includes the stiffeners 510 formed directly on the dies 504-505 but not on the dicing streets 515.

Note that the stiffener 510 of FIG. 10 may be noticeably similar to the stiffener 210 as illustrated in FIGS. 2-3.

FIGS. 11A-C are plan views of dies 205 with one or more stiffener patterns 210a-c. For some embodiments, the stiffener 210 may be formed to cover the entire back side of the die 205 as a stiffener 210a. For other embodiments, the stiffener 210 may be formed directly on the back side of the die 205 having custom-shaped structures, such as a picture-frame stiffener 210b or an I-shaped stiffener 210c. This can be used to optimize the stiffener design for each particular die to reduce warpage. At the same time, this can also be used to (i) reduce stiffener material consumption and cost (e.g., if expensive materials such as diamond particles are used), and/or (ii) reduce the thermal mass added to the die which is important if using thermal compression bonding (TCB) for die assembly.

Note that the stiffeners 210a-c of FIGS. 11A-C may be noticeably similar to the stiffener 210 as illustrated in FIGS. 2-3.

Figure 12:
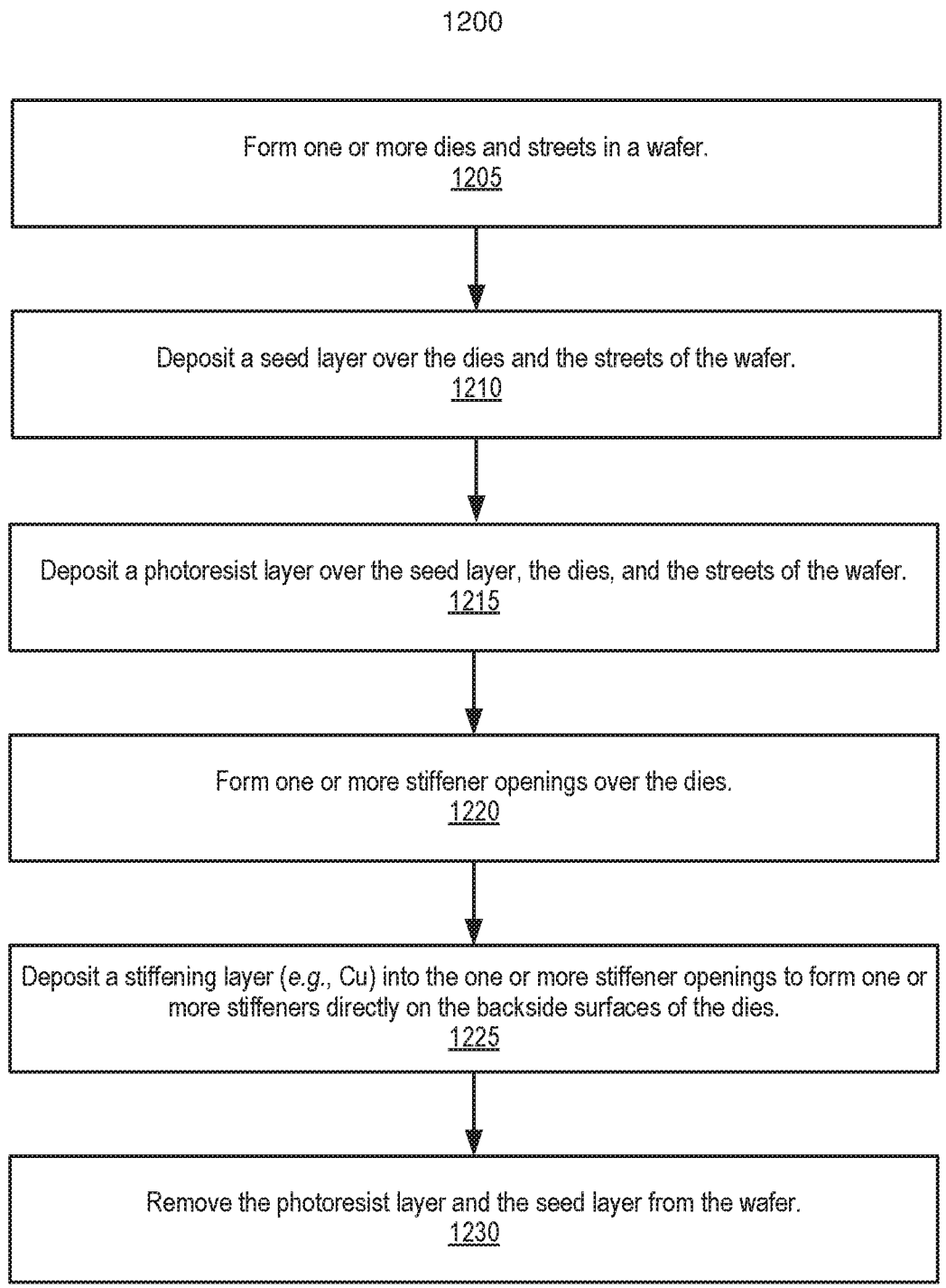
FIG. 12 is a process flow illustrating a method of forming a stiffener on a back side of a die on a wafer, according to one embodiment.

FIG. 12 illustrates a process flow 1300 of forming a stiffener on a back side of a die in a wafer. Process flow 1200 illustrates a method of forming the stiffener on the back side of the die based on one or more manufacturing processes. For example, process flow 1200 shows a method of forming a stiffener as shown in FIGS. 5-10. For other embodiments, a process flow as described in FIG. 4 may be implemented with an additive manufacturing process (e.g., cold spray).

At block 1205, the process flow 1200 forms one or more dies and streets in a wafer (as shown in FIG. 5). At block 1210, the process flow 1200 deposits a seed layer over the dies and the streets of the wafer (as shown in FIG. 6). At block 1215, the process flow 1200 then deposits a photoresist layer over the seed layer, the dies, and the streets of the wafer (as shown in FIG. 7). At block 1220, the process flow 1200 forms one or more stiffener openings over the dies (as shown in FIG. 8). At block 1225, the process flow 1200 deposits a stiffening layer (e.g., Cu) into the one or more stiffener openings to form one or more stiffeners directly on the backside surfaces of the dies (as shown in FIG. 9). Lastly, at block 1230, the process flow 1200 removes the photoresist layer and the seed layer from the wafer (as shown in FIG. 10).

In addition, a process flow as shown in FIG. 4 may be used to create a stiffener on a back side of a die. For example, the process flow may form one or more dies and streets in a wafer. Then, the process flow may deposit (or spray) a stiffening layer (e.g., Cu/diamond) onto a shadow mask or stencil having one or more stiffener openings to form one or more stiffeners directly on the back sides of the dies (as shown in FIG. 4). Note that a stiffener may be created using one or more manufacturing processes, and the one or more processes may be selected based on the desired materials, costs, and/or overall package design.

Figure 13:
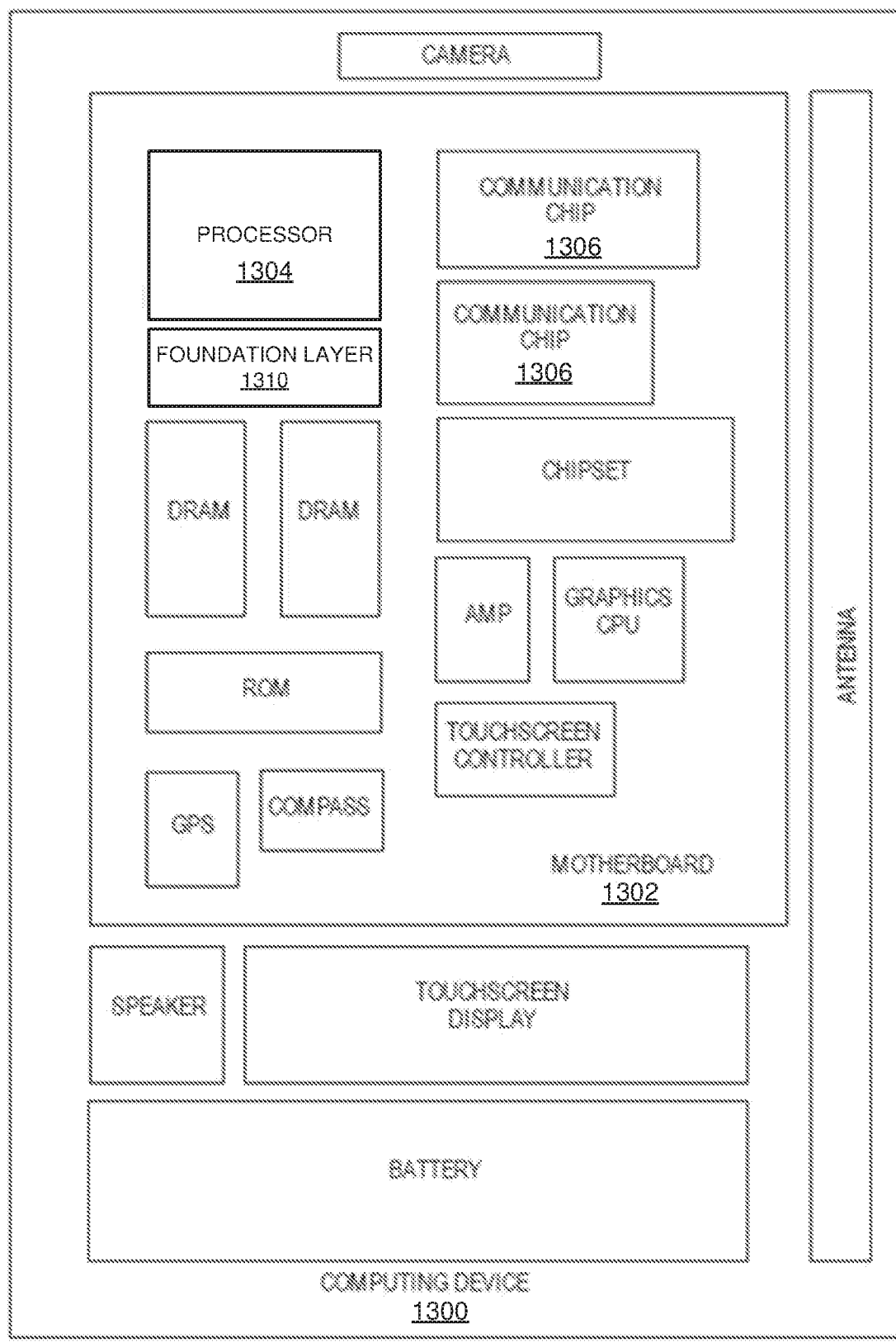
FIG. 13 is a schematic block diagram illustrating a computer system that utilizes a foundation layer with a stiffener, according to one embodiment.

FIG. 13 is a schematic block diagram illustrating a computer system that utilizes a foundation layer with a stiffener, as described herein. FIG. 13 illustrates an example of computing device 1300. Computing device 1300 houses motherboard 1302. Motherboard 1302 may include a number of components, including but not limited to processor 1304, foundation layer 1310, and at least one communication chip 1306. Processor 1304 is physically and electrically coupled to motherboard 1302. For some embodiments, at least one communication chip 1306 is also physically and electrically coupled to motherboard 1302. For other embodiments, at least one communication chip 1306 is part of processor 1304.

Depending on its applications, computing device 1300 may include other components that may or may not be physically and electrically coupled to motherboard 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 1306 enables wireless communications for the transfer of data to and from computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

Processor 1304 of computing device 1300 includes an integrated circuit die packaged within processor 1304. Foundation layer 1310 may be, but is not limited to, a silicon die, a packaging substrate, and/or a printed circuit board. Foundation layer 1310 may include one or more stiffeners (e.g., stiffeners 210 of FIG. 3) attached directly on one or more dies of the computing device 1300. Further, the one or more stiffeners of foundation layer 1310 help to mitigate package warpage in the computing device 1300 by providing a stiff layer on top of the dies that counteracts the CTE mismatch between the dies and their substrates.

Note that foundation layer 1310 may be a single component, a subset of components, and/or an entire system, as the stiffeners may be limited to foundation layer 1310 and/or any other component that requires stiffeners to mitigate package warpage.

For some embodiments, the integrated circuit die may be packaged with one or more devices on foundation layer 1310 that include a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 1306 also includes an integrated circuit die packaged within the communication chip 1306. For some embodiments, the integrated circuit die of the communication chip may be packaged with one or more devices on foundation layer 1310, as described herein, to mitigate the package warpage using the stiffeners.

The following examples pertain to further embodiments. The various features of the different embodiments may be variously combined with some features included and others excluded to suit a variety of different applications.

The following examples pertain to further embodiments:

For one embodiment, a device package comprising: a foundation layer having one or more dies disposed on the foundation layer, wherein each die has a front side surface that is electrically coupled to the foundation layer and a back side surface that is opposite from the front side surface; and a stiffening layer formed on the back side surface of at least one of the one or more dies.

For one embodiment of the device package, wherein the stiffening layer is directly coupled to the back side surface of the one or more dies without an adhesive layer.

For one embodiment of the device package, wherein the stiffening layer includes one or more materials, and wherein the one or more materials include at least one of a metal, a metal alloy, and a ceramic.

For one embodiment, the device package further comprising a motherboard formed below the foundation layer, wherein the motherboard is electrically coupled to the foundation layer.

For one embodiment of the device package, wherein the stiffening layer is formed to reduce warpage based on the foundation layer and the one or more dies.

For one embodiment of the device package, wherein the one or more materials of the stiffening layer are formed on the back side of the die using a cold spray process.

For one embodiment of the device package, wherein the stiffening layer is formed using one or more patterns.

For one embodiment, the device package further comprising a gap between each of the one or more dies, and wherein the stiffening layer is formed directly on the one or more dies and not formed on the gap.

For one embodiment, the device package further comprising an underfill layer formed between the one or more dies and the foundation layer.

For one embodiment of the device package, wherein the stiffening layer is formed on the die at a wafer level or a panel level.

For one embodiment of the device package, wherein the foundation layer is a printed circuit board.

For some embodiments, a method of forming a device package, the method comprising: disposing one or more dies on a foundation layer, wherein each die has a front side surface that is electrically coupled to the foundation layer and a back side surface that is opposite from the front side surface; and depositing a stiffening layer on the back side surface of at least one of the one or more dies.

For one embodiment of the method, wherein the stiffening layer is directly coupled to the back side surface of the one or more dies without an adhesive layer.

For one embodiment of the method, wherein the stiffening layer includes one or more materials, and wherein the one or more materials include at least one of a metal, a metal alloy, and a ceramic.

For one embodiment, the method further comprising forming a motherboard below the foundation layer, wherein the motherboard is electrically coupled to the foundation layer.

For one embodiment of the method, wherein the stiffening layer is formed to reduce warpage based on the foundation layer and the one or more dies.

For one embodiment of the method, wherein the one or more materials of the stiffening layer are formed on the back side of the die using a cold spray process.

For one embodiment of the method, wherein the stiffening layer is formed using one or more patterns.

For one embodiment, the method further comprising a gap between each of the one or more dies, and wherein the stiffening layer is formed directly on the one or more dies and not formed on the gap.

For one embodiment, the method further comprising forming an underfill layer between the one or more dies and the foundation layer.

For one embodiment of the method, wherein the stiffening layer is formed on the die at a wafer level or a panel level.

For one embodiment of the method, wherein the foundation layer is a printed circuit board.

For other embodiments, a method of forming a die with a stiffening structure on a back side surface of the die, the method comprising: forming one or more dies and one or more dicing streets on a wafer; depositing a seed layer over the one or more dies and dicing streets formed on the wafer; depositing a photoresist layer over the seed layer and patterning the photoresist layer to form one or more stiffener openings over the one or more dies but not over the one or more dicing streets; depositing a stiffening layer into the one or more stiffener openings to form one or more stiffeners on the back side surfaces of the one or more dies; and removing the photoresist layer and the seed layer after the one or more stiffeners are formed on the back side surfaces of the one or more dies.

For one embodiment of the method, wherein the one or more stiffeners are directly coupled to the back side surfaces of the one or more dies without an adhesive layer, and wherein the stiffening layer includes one or more materials that include at least one of a metal, a metal alloy, and a ceramic.

For one embodiment of the method, wherein the one or more stiffeners are formed using one or more patterns.

In the foregoing specification, embodiments have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A device package, comprising:
   a foundation layer having a die disposed on the foundation layer, wherein the die has a front side surface that is electrically coupled to the foundation layer and a back side surface that is opposite from the front side surface; and
   a stiffening layer formed on the back side surface of the die, wherein the stiffening layer has an I-shape.

2. The device package of claim 1, wherein the stiffening layer is directly coupled to the back side surface of the die without an adhesive layer.

3. The device package of claim 1, wherein the stiffening layer includes one or more materials, and wherein the one or more materials include at least one of a metal, a metal alloy, and a ceramic.

4. The device package of claim 1, further comprising a motherboard formed below the foundation layer, wherein the motherboard is electrically coupled to the foundation layer.

5. The device package of claim 1, wherein the stiffening layer is formed to reduce warpage based on the foundation layer and the die.

6. The device package of claim 3, wherein the one or more materials of the stiffening layer are formed on the back side of the die using a cold spray process.

7. The device package of claim 1, wherein the stiffening layer is formed using one or more patterns.

8. The device package of claim 1, further comprising an underfill layer formed between the die and the foundation layer.

9. The device package of claim 1, wherein the stiffening layer is formed on the die at a wafer level or a panel level.

10. The device package of claim 1, wherein the foundation layer is a printed circuit board.

11. A method of forming a device package, the method comprising:
    disposing a die on a foundation layer, wherein the die has a front side surface that is electrically coupled to the foundation layer and a back side surface that is opposite from the front side surface; and
    forming a stiffening layer on the back side surface of the die, wherein the stiffening layer has an I-shape.

12. The method of claim 11, wherein the stiffening layer is directly coupled to the back side surface of the die without an adhesive layer.

13. The method of claim 11, wherein the stiffening layer includes one or more materials, and wherein the one or more materials include at least one of a metal, a metal alloy, and a ceramic.

14. The method of claim 11, further comprising forming a motherboard below the foundation layer, wherein the motherboard is electrically coupled to the foundation layer.

15. The method of claim 11, wherein the stiffening layer is formed to reduce warpage based on the foundation layer and the die.

16. The method of claim 13, wherein the one or more materials of the stiffening layer are formed on the back side of the die using a cold spray process.

17. The method of claim 11, wherein the stiffening layer is formed using one or more patterns.

18. The method of claim 11, further comprising forming an underfill layer between the die and the foundation layer.

19. The method of claim 11, wherein the stiffening layer is formed on the die at a wafer level or a panel level.

20. The method of claim 11, wherein the foundation layer is a printed circuit board.

* * * * *